United States Patent
Takizawa

(10) Patent No.: US 9,954,521 B2
(45) Date of Patent: Apr. 24, 2018

(54) GATE DRIVE CIRCUIT FOR SEMICONDUCTOR SWITCHING DEVICES

(71) Applicant: FUJI ELECTRIC CO., LTD., Kawasaki-shi, Kanagawa (JP)

(72) Inventor: Satoki Takizawa, Hino (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 15/378,000

(22) Filed: Dec. 13, 2016

(65) Prior Publication Data
US 2017/0207782 A1 Jul. 20, 2017

(30) Foreign Application Priority Data
Jan. 14, 2016 (JP) .................................. 2016-005412

(51) Int. Cl.
| H02M 1/088 | (2006.01) |
| H03K 17/284 | (2006.01) |
| H02M 7/5381 | (2007.01) |
| H02M 7/537 | (2006.01) |
| H03K 17/567 | (2006.01) |
| H03K 17/0812 | (2006.01) |
| H03K 17/16 | (2006.01) |

(52) U.S. Cl.
CPC .......... *H03K 17/284* (2013.01); *H02M 1/088* (2013.01); *H02M 7/537* (2013.01); *H02M 7/5381* (2013.01); *H03K 17/08122* (2013.01); *H03K 17/164* (2013.01); *H03K 17/567* (2013.01)

(58) Field of Classification Search
CPC ........... H03K 17/08122; H03K 17/164; H03K 17/284; H03K 17/567; H02M 1/088; H02M 7/537; H02M 7/538; H02M 7/5381; H02M 2001/0051
See application file for complete search history.

(56) References Cited

U.S. PATENT DOCUMENTS

| 6,819,149 B2* | 11/2004 | Shirasawa ............ H03K 17/162 327/112 |
| 7,061,301 B2* | 6/2006 | Pham ................ H03K 17/04206 327/379 |
| 7,570,085 B2* | 8/2009 | Ishikawa ............ H03K 17/0406 327/108 |
| 9,450,517 B2* | 9/2016 | Kusama ................ H02M 7/537 |

FOREIGN PATENT DOCUMENTS

| JP | 2004-129378 A | 4/2004 |
| JP | 2006-296119 A | 10/2006 |

* cited by examiner

*Primary Examiner* — Patrick O'Neill
(74) *Attorney, Agent, or Firm* — Rabin & Berdo, P.C.

(57) ABSTRACT

A gate drive circuit includes first and second transistors for turning on and off semiconductor switching devices. The circuit includes a DC power supply for driving the first and second transistors. The gate drive circuit further includes a third transistor, a fourth transistor, and a DC power supply being a power supply for the third and fourth transistors with a voltage value lower than the voltage value of the DC power supply, thereby making lower the impedance of the path of a current flowing from the DC power supply to the gates of the switching devices through the third transistor than the impedance of the path of a current flowing from the DC power supply to the gates of the switching devices through the first transistor.

8 Claims, 9 Drawing Sheets

GATE DRIVE CIRCUIT FOR SEMICONDUCTOR SWITCHING DEVICES

BACKGROUND OF THE INVENTION

1. Field of the Invention

The present invention relates to a gate drive circuit for voltage-driven type semiconductor switching devices used in an electric power converter.

2. Background Art

FIG. 4 is a diagram showing the configuration of a main circuit of an inverter using voltage-driven type semiconductor switching devices.

The main circuit of the inverter shown in FIG. 4 includes a DC power supply 1, an inverter section 2 in three-phase including voltage-driven type semiconductor switching devices 2a to 2f (hereinafter referred to as switching devices 2a to 2f), gate drive circuits 3a and 3b and a control circuit 4. From the control circuit 4, control signals $S_a$ and $S_b$ are given to the gate drive circuits 3a and 3b, respectively. The reference sign M designates a motor as a load.

The DC power supply 1 may be substituted by a circuit with a rectifying circuit that rectifies an AC power supply voltage and an electrolytic capacitor. In addition, although FIG. 4 shows the gate drive circuits 3a and 3b and the control signals $S_a$ and $S_b$ only with respect to the semiconductor switching devices 2a and 2b, respectively, the other semiconductor switching devices 2c to 2f are similarly provided with gate drive circuits 3c to 3f to which control signal $S_c$ to $S_f$ are given, respectively.

For the voltage-driven type switching devices 2a to 2f, in addition to MOSFETs as illustrated, IGBTs are sometimes used, in which case each of the IGBT main bodies has a freewheeling diode connected in inverse-parallel thereto.

Since both of the gate drive circuits 3a and 3b have the same configurations, the configuration of the gate drive circuit 3a driving the switching devices 2a will be explained here.

FIG. 5 is a diagram showing the configuration of a gate drive circuit $3a_1$ as a first related art. In FIG. 5, the gate drive circuit $3a_1$ includes a driving section 31 formed of a device such as a photocoupler to which the control signal $S_a$ is inputted, a DC power supply 32 (with the voltage value thereof taken as $V_B$) for driving the circuit, a base resistor 33 with one end thereof connected to the driving section 31, transistors 34 and 35 connected in series with their respective bases connected to the other end of the base resistor 33 and their respective emitters connected to the gate of the switching device 2a to form totem-pole output transistors that output a non-inverted signal of the input signal, and current limiting resistors 36 and 37 connected in series to the transistors 34 and 35, respectively.

Here, the transistor 34 for making the switching device 2a turned-on is an n-p-n type and the transistor 35 for making the switching device 2a turned-off is an n-p-n type. The transistors 34 and 35 are operated to be complementarily turned-on and -off by a signal $S_1$ applied to their respective bases which signal is inputted through the base resistor 33 from the driving section 31.

For the power supply of the circuit, a positive and negative power supplies are sometimes provided instead of the DC power supply 32 while being made to correspond to the respective transistors 34 and 35.

The operation of the gate drive circuit $3a_1$ shown in FIG. 5 will be explained in detail. When the signal $S_1$ is at a "High" level, the transistor 34 is turned-on to make a current flow into the gate of the switching device 2a. When this makes the gate-source voltage $V_{GS}$ of the switching device 2a exceed the gate threshold voltage (hereinafter sometimes also simply referred to as a threshold voltage) $V_{th}$ of the switching device 2a, the switching device 2a is made to be turned-on. While, when the signal $S_1$ is at a "Low" level, the transistor 35 is turned-on to make a current flow in the direction of discharging electric charges stored in the gate of the switching device 2a. This makes the switching device 2a turned-off.

Here, by adjusting the resistance values of the base resistor 33 and the current limiting resistors 36 and 37, the waveform of the gate-source voltage of the switching device 2a at the switching thereof is controlled so that the rising and falling in the waveform are prevented from becoming excessively abrupt for carrying out the suppression of a surge voltage.

The gate drive circuit as is shown in FIG. 5 is described in JP-A-2004-129378 (paragraph [0005] and FIG. 8 etc.), for example.

In the next, FIG. 6 is a diagram showing the configuration of a gate drive circuit $3a_2$ as a second related art. The gate drive circuit $3a_2$ is that in which an active Miller clamp circuit including a transistor 38 is added to the circuit shown in FIG. 5 as will be explained later.

In the circuit shown in FIG. 5, when the switching device 2a is being made to be turned-off with the transistor 35 for turning-off being made to be turned-on, the switching device 2b in the opposite arm shown in FIG. 4 is also in a turned-off state, and a body diode in a state of being connected in inverse parallel to the switching device 2a has a freewheeling current flowing therein in the direction opposite to that of the current to flow in the switching device 2a, the change in the switching device 2b from the turned-off state to a turned-on state causes the power supply voltage to be suddenly applied to the turned-off switching device 2a. This also causes the power supply voltage to be suddenly applied to the body diode of the switching device 2a as a reverse voltage. Thus, at the reverse recovery of the body diode of the switching device 2a, when the gate-drain voltage v of the switching device 2a changes with respect to time t with a large voltage variation rate dv/dt, a current i flows into the gate of the switching device 2a through a leakage capacitor (capacitance C) between the gate and drain of the switching device 2a as is shown in broken lines with a comparatively large value (i=C·dv/dt). This causes the gate-source voltage $V_{GS}$ of the switching device 2a to be going to rise. When the gate-source voltage $V_{GS}$ of the switching device 2a exceeds the threshold voltage $V_{th}$ thereof, the switching device 2a is made to be turned-on to result in a short circuit between the upper and lower arms to possibly cause the switching devices 2a and 2a' to be broken down in the worst case.

For preventing this, as is shown in FIG. 6, a transistor 38 is connected between the gate and source of the semiconductor switching device 2a so as to force the transistor 38 to turn-on when the semiconductor switching device 2a is made to be turned-off. This lowers the impedance between the gate and source of the semiconductor switching device 2a to prevent the turning-on thereof. In this case, the gate of the switching device 2a is connected to a driving section 31a with a signal line 39 and the base of the transistor 38 is also connected to the driving section 31a, by which an active Miller clamp circuit is formed. The active Miller clamp circuit is a circuit which actively detects and makes a judgement at the driving section 31a on the rising of the gate-source voltage $V_{GS}$ of the switching device 2a due to the influence of the leakage capacitor (Miller capacitor) between the gate and drain of the switching device 2a and then clamps the rising.

The control operation for turning-on the transistor 38 is that in which the driving section 31a detects the gate-source voltage $V_{GS}$ of the semiconductor switching device 2a through a signal line 39 and then outputs a forced-on signal $S_2$ to provide it to the base of the transistor 38 before the gate-source voltage $V_{GS}$ reaches the threshold voltage $V_{th}$.

The gate drive circuit provided with such an active Miller clamp circuit as is shown in FIG. 6 is described in JP-A-2006-296119 (paragraph [0008] and FIG. 2 etc.), for example.

[Patent Document 1] JP-A-2004-129378 (paragraph [0005] and FIG. 8 etc.)

[Patent Document 2] JP-A-2006-296119 (paragraph [0008] and FIG. 2 etc.)

Incidentally, in general, for enlarging the capacity of a system, a plurality of switching devices in each arm of a system such as an inverter are sometimes used while being connected in parallel.

FIG. 7 is a diagram showing the circuit configuration in the case when two switching devices 2a and 2a' being connected in parallel to each other are driven by the gate drive circuit $3a_1$ with the circuit configuration thereof being the same as that of the gate drive circuit $3a_1$ shown in FIG. 5. In FIG. 7, reference signs $i_1$ and $i_2$ designate the drain currents of the semiconductor switching devices 2a and 2a', respectively.

Variation in characteristic in the threshold voltage $V_{th}$ of each of the semiconductor switching devices 2a and 2a' shown in FIG. 7 causes a time lag between the switching timings of the semiconductor switching devices 2a and 2a'. FIG. 8 is a waveform diagram showing the gate-source voltage $V_{GS}$ of one of the switching devices 2a and 2a' shown in FIG. 7. That is, as is shown in FIG. 8, for an increasing gate-source voltage $V_{GS}$, a device with a low threshold voltage $V_{th}$ turns on at a time $t_1$, while a device with a high threshold voltage $V_{th}$ is to turn on at a time $t_2$ to cause a time lag $\Delta t$ between the times $t_1$ and $t_2$. This causes a large current to flow during the time lag $\Delta t$ in the device turned on earlier, which results in concentrated production of a switching loss in the device.

FIGS. 9 and 10 are waveform diagrams each showing the waveforms of the drain currents $i_1$ and $i_2$ of their respective switching devices 2a and 2a'. FIG. 9 shows the case in which the difference between the threshold voltage $V_{th1}$ of the switching device 2a and the threshold voltage $V_{th2}$ of the switching device 2a' (in other words, the difference between the turning-on time $t_1$ and the turning-on time $t_2$) is small. FIG. 10 shows the case in which the difference between the threshold voltage $V_{th1}$ and the threshold voltage $V_{th2}$ is large. As is apparent from FIGS. 9 and 10, a larger time lag $\Delta t$ causes an imbalance between the drain currents $i_1$ and $i_2$.

In addition, FIG. 11 is a waveform diagram showing the waveforms of currents $i_{1d}$ and $i_{2d}$ of two diodes each being at the reverse recovery thereof which diodes are respectively connected to two switching devices (when the switching devices are MOSFETs, the diodes are body diodes) connected in parallel to each other in the arm on the opposite side of the arm provided with the two semiconductor switching devices 2a and 2a' having a large difference between their respective gate threshold voltages $V_{th1}$ and $V_{th2}$ and being connected in parallel to each other.

A large difference between the threshold voltages $V_{th1}$ and $V_{th2}$ of their respective switching devices 2a and 2a', even though the diodes have characteristics equal to each other in the arm on the opposite side, causes a considerable imbalance in drain current between the switching devices 2a and 2a' also by the additional difference between wiring-structural factors of the paths from each switching device to each diode and wiring-structural factors around the diodes. As a result, also in the diodes on the opposite arm side, an imbalance is created between their respective currents $i_{1d}$ and $i_{2d}$ as is shown in FIG. 11 when the diodes are brought from freewheeling states to reverse recovery states in the transient state in which the switching devices 2a and 2a' are brought from a turned-off states to turned-on states.

Therefore, with respect to the gate drive circuit, the loss design and the thermal design thereof must be carried out with variations in the gate threshold voltages of the switching devices taken into consideration. This inevitably causes the design work of the gate drive circuit to be redundant compared with the case in which no variations are found in switching devices to be used, that is, the case in which the characteristics in all switching devices are identical. The redundancy in design can be lessened by individual control of the characteristics of all of switching devices. This, however, causes an increase in the expense required for the individual control of the characteristics, which inevitably results in a rise in cost by the amount of the increase.

Incidentally, by providing the active Miller clamp circuit explained in the foregoing also in the gate drive circuit in the circuit shown in FIG. 7, the switching devices 2a and 2a' can be prevented from unnecessary turning-on. This, however, increases the scale of the gate drive circuit and, along with this, necessitates an exclusive IC provided with the control circuit of the active Miller clamp circuit and other control functions, which also caused the rise in cost.

Furthermore, even though the active Miller clamp circuit is provided, the disadvantage due to the imbalance in current caused by the difference between the threshold voltages $V_{th1}$ and Vth2 remains unsolved.

Accordingly, it is an object of the invention to provide a gate drive circuit which, when driving a plurality of semiconductor switching devices connected in parallel to each other in each of the upper and lower arms in the gate drive circuit, inhibits the imbalance in current between the semiconductor switching devices due to the difference between gate threshold voltages of the switching devices and, along with this, without increasing the scale of the circuit, makes it possible to prevent a short circuit in the upper and lower arms when the semiconductor switching devices in the opposite arm are made to be turned-on.

SUMMARY OF THE INVENTION

In order to achieve the foregoing object, a first aspect of the invention includes a gate drive circuit for semiconductor switching devices which is provided for driving a group of switching devices formed of a plurality of voltage driving type semiconductor switching devices connected in parallel to each other. The gate drive circuit is commonly connected to the gates of the group of the switching devices and includes a first switch for turning-on the group of the switching devices; a second switch connected in series to the first switch to turn-off the group of the switching devices; a first current limiting resistor limiting the current flowing in the first switch; a second current limiting resistor limiting the current flowing in the second switch; and at least a first DC power supply as a power supply for driving the first switch and the second switch. The gate drive circuit further includes a third switch made to be turned-on by a turning-on instruction signal to the first switch to turn-on the group of the switching devices; a fourth switch made to be turned-off by a turning-off instruction signal to the second switch to turn-off the group of the switching devices; and a second DC power supply connected across a DC circuit including the third switch and the fourth switch as a power supply for driving the third switch and the fourth switch with a voltage value lower than the voltage value of the first DC power supply, thereby making lower the impedance of the path of a current flowing from the second DC power supply to the gates of the group of the switching devices through the third switch in a turned-on state than the impedance of the path of a current flowing from the first DC power supply to the gates of the group of the switching devices through the first switch in a turned-on state.

A second aspect of the invention is that in the gate drive circuit for semiconductor switching devices according to the first aspect, the value of the voltage of the second DC power supply is made to be approximately equal to the maximum value of the gate threshold voltages of the group of switching devices.

A third aspect of the invention is that the gate drive circuit for semiconductor switching devices according to the first or second aspect further includes a turn-off delay circuit for delaying the timing of making the fourth switch turned-on for a specified time from the timing of making the second switch turned-on.

A fourth aspect of the invention is that in the gate drive circuit for semiconductor switching devices according to any one of the first to third aspects, the second DC power supply is formed of a series circuit of a resistor and a Zener diode, which circuit is connected across the first DC power supply, and a capacitor connected in parallel to the Zener diode, the voltage across the capacitor being used as the voltage of the second DC power supply.

According to the gate drive circuit of the invention, when a plurality of semiconductor devices are driven which are connected in parallel to each other, the gate drive circuit can simultaneously perform the function of inhibiting the imbalance in current between the switching devices in the main circuit due to the difference between the gate threshold voltages of the switching devices and the function of preventing the upper and lower arms from being short-circuited with the reverse recovery phenomenon of each of the diodes when switching devices in the opposite arm are made to be turned-on.

This can resolve the problem of causing the design work to be redundant and the problem of requiring the expense for the individual control of the characteristics of all of switching devices. In addition, an increase in the scale of the circuit is avoided to enable cost reduction.

DETAILED DESCRIPTION

In the following, an embodiment of the invention will be explained in order of the attached drawings.

Figure 1:
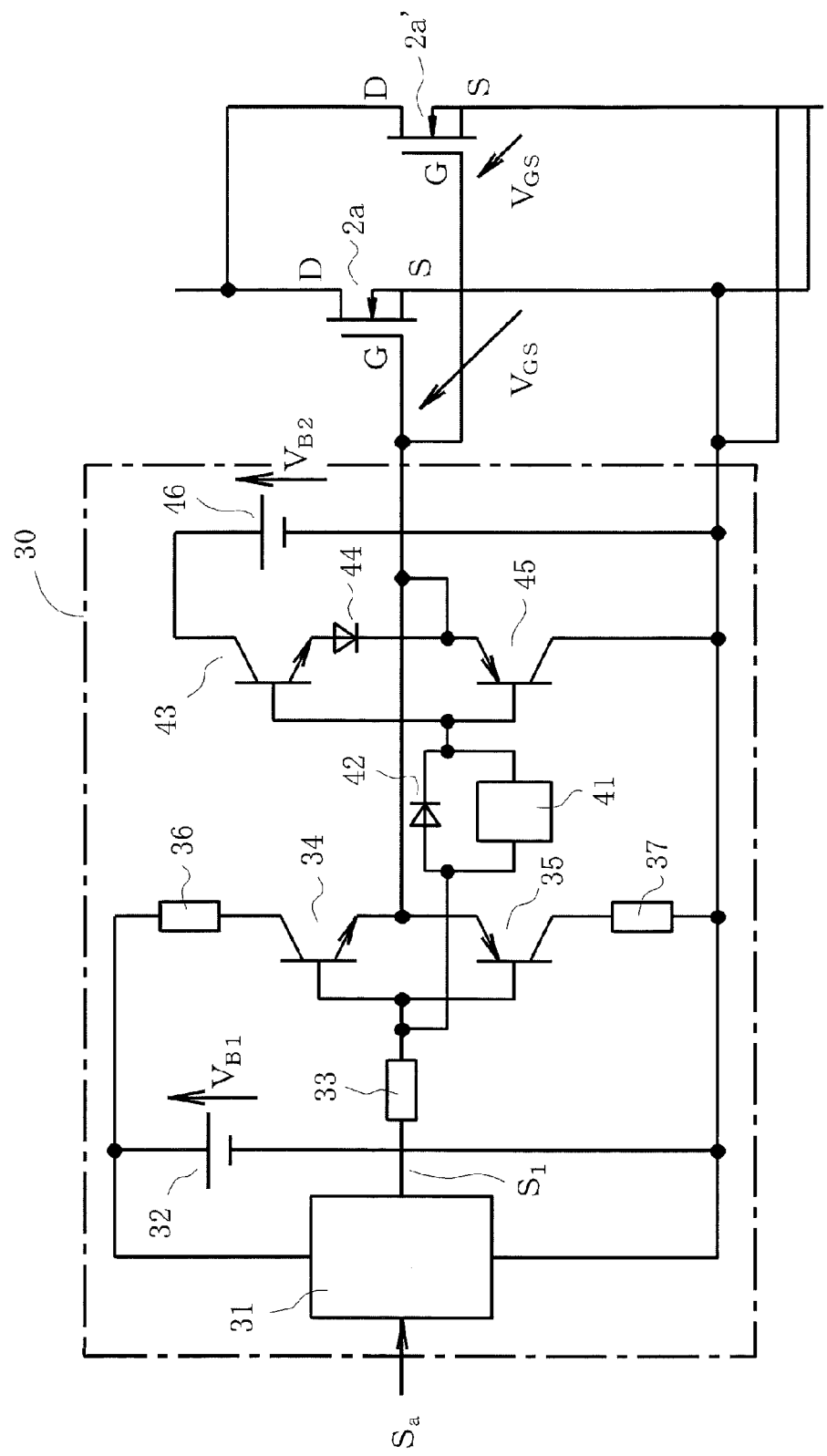
FIG. 1 is a diagram showing the configuration of a gate drive circuit according to an embodiment of the invention together with semiconductor switching devices as driving objects.

FIG. 1 is a diagram showing the configuration of a gate drive circuit 30 according to an embodiment of the invention together with semiconductor switching devices 2a and 2a' as driving objects. In the embodiment, like in the circuit shown in FIG. 7, the two switching devices 2a and 2a' are connected in parallel to each other in one arm in the circuit such as an inverter, by which the case is assumed in which the gate drive circuit 30 drives the switching devices 2a and 2a'.

Figure 7:
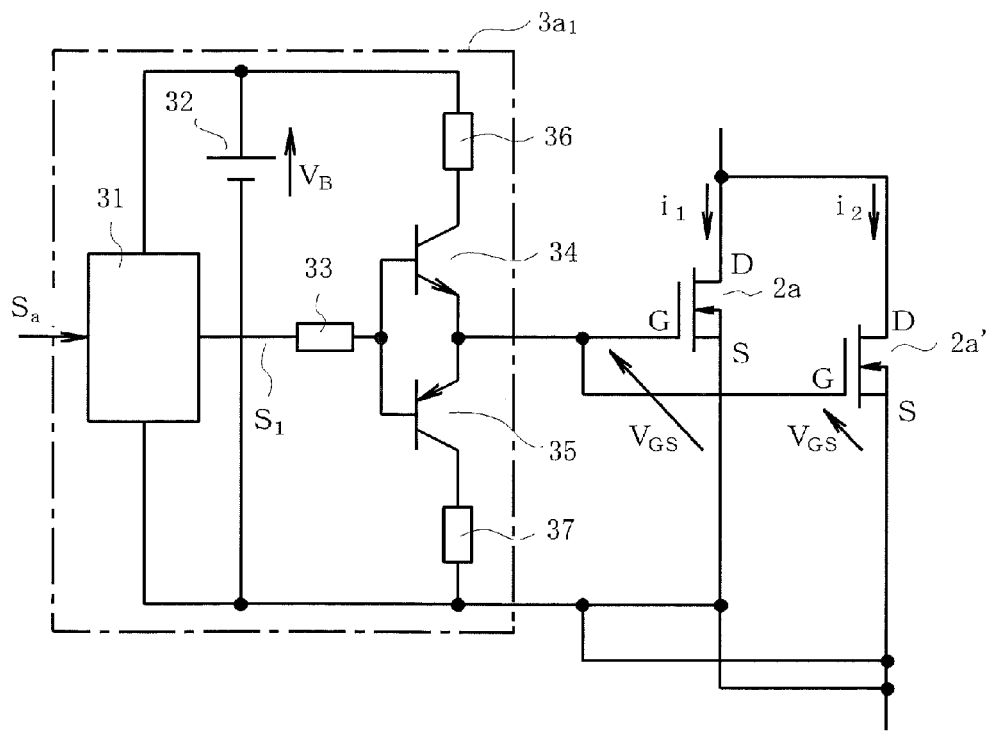
FIG. 7 is a diagram showing the circuit configuration in the case when two switching devices being connected in parallel to each other are driven by a gate drive circuit with the circuit configuration thereof being the same as that of the gate drive circuit shown in FIG. 5.
Figure 8:
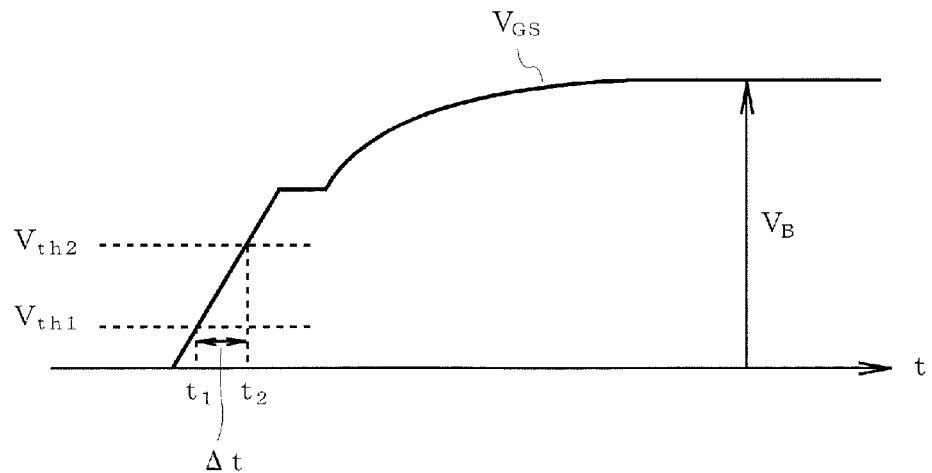
FIG. 8 is a waveform diagram showing the gate-source voltage of one of the switching devices shown in FIG. 7.

In FIG. 1, parts similar to those shown in FIG. 7 are denoted with the same reference numerals and signs. Therefore, the gate drive circuit 30 will be explained with emphasis on parts different from those shown in FIG. 7.

In the gate drive circuit 30 shown in FIG. 1, a turn-off delay circuit 41, diodes 42 and 44, an n-p-n transistor 43 (hereinafter referred to as a transistor 43) and p-n-p transistor 45 (hereinafter referred to as a transistor 45) forming totem-pole output transistors and a DC power supply 46 are additionally provided to the gate drive circuit $3a_1$ shown in FIG. 7. That is, a parallel circuit of the turn-off delay circuit 41 and the diode 42 is connected between the commonly connected bases of the transistors 34 and 35 and the commonly connected bases of the transistors 43 and 45 and, between the emitters of the transistors 43 and 45, a diode 44 is connected. Along with this, a DC power supply 46 is connected between the collectors of the transistors 43 and 45. The emitter of the transistor 45 is connected to the gates of the semiconductor switching devices 2a and 2a' together with the emitters of the transistor 34 and 35.

The diode 44 is provided for preventing the transistor 43 from a reverse voltage applied thereto when the transistors 34 and 35 are simultaneously turned-on.

Figure 2:
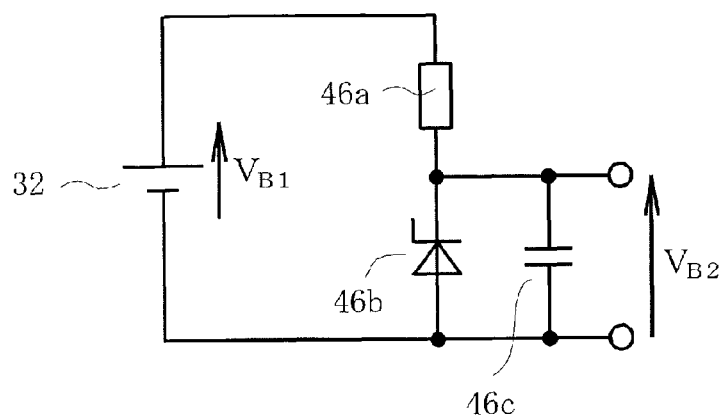
FIG. 2 is a diagram showing another configuration of the low voltage DC power supply.

Here, it is preferable that the value of the voltage $V_{B2}$ of the DC power supply 46 is determined to be a value lower than the value of the voltage $V_{B1}$ of the DC power supply 46 ($V_{B2} < V_{B1}$) and to be a value on the order of the larger one of the maximum values of the gate threshold voltages $V_{th1}$ and $V_{th2}$ of their respective semiconductor switching devices 2a and 2a'. The voltage $V_{B2}$ may be obtained from the DC power supply 46 formed independently of the DC power supply 32 on the input side as is shown in FIG. 1. The voltage $V_{B2}$ may be also obtained from a circuit connected to the DC power supply 32 as is shown in FIG. 2, a diagram showing another configuration of the low voltage DC power supply. In the circuit, a resistor 46a and a Zener diode 46b are connected in series to the DC power supply 32 with a capacitor 46c connected in parallel to the Zener diode 46b. The voltage $V_{B2}$ is provided as a voltage across the capacitor 46c.

In addition, the DC power supplies 32 and 46 are provided as a first and second DC power supplies, respectively, and the transistors 34, 35, 43 and 45 are provided as a first, second, third and fourth switches, respectively. Moreover, the current limiting resistors 36 and 37 are provided as a first and second current limiting resistor, respectively. The DC power supply 32 as the first DC power supply may be provided not only as a positive side power supply as is shown in FIG. 1 but also as a positive side power supply and negative side power supply which are made to correspond to the transistors 34 and 35, respectively.

In the foregoing configuration, the switching devices 2a and 2a' may be formed of IGBTs and the number thereof in parallel connection may be more than three. Moreover, the transistors 34, 35, 44 and 45 as the first to fourth switches, respectively, are not limited to be bipolar transistors but FETs may be used for them.

Furthermore, the current limiting resistors 36 and 37 as the first and second current limiting resistors may be connected onto the emitter sides of the transistors 34 and 35, respectively.

Subsequent to this, the operation of the embodiment will be explained.

At the turning-on of the switching devices 2a and 2a', the signal $S_1$, outputted from the driving section 31 to instruct turning-on on the basis of the control signal $S_a$ instructing turning-on, is applied to the base of the transistor 34 for turning-on through the base resistor 33. The signal $S_1$ is simultaneously applied to the base of the transistor 43 for turning-on through the base resistor 33 and the diode 42. This turns on both of the transistors 34 and 43.

At this time, on the side of the transistor 43, no current limiting resistor such as the resistor 36 on the side of the transistor 34 exists in the output current path to provide a low impedance in the output current path. Thus, a current rapidly flows onto the gate side of the switching devices 2a and 2a' through the transistor 43 and diode 44 from the DC power supply 46 with the voltage $V_{B2}$.

Thereafter, from the time at which the gate-source voltage $V_{GS}$ of each of the switching devices 2a and 2a' reaches the voltage $V_{B2}$, a current from the DC power supply 32, having the voltage $V_{B1}$ higher than voltage $V_{B2}$, flows onto the gate side of each of the switching devices 2a and 2a' through the current limiting resistor 36 and the transistor 34, by which the gate potential $V_{GS}$ is finally established.

Figure 3:
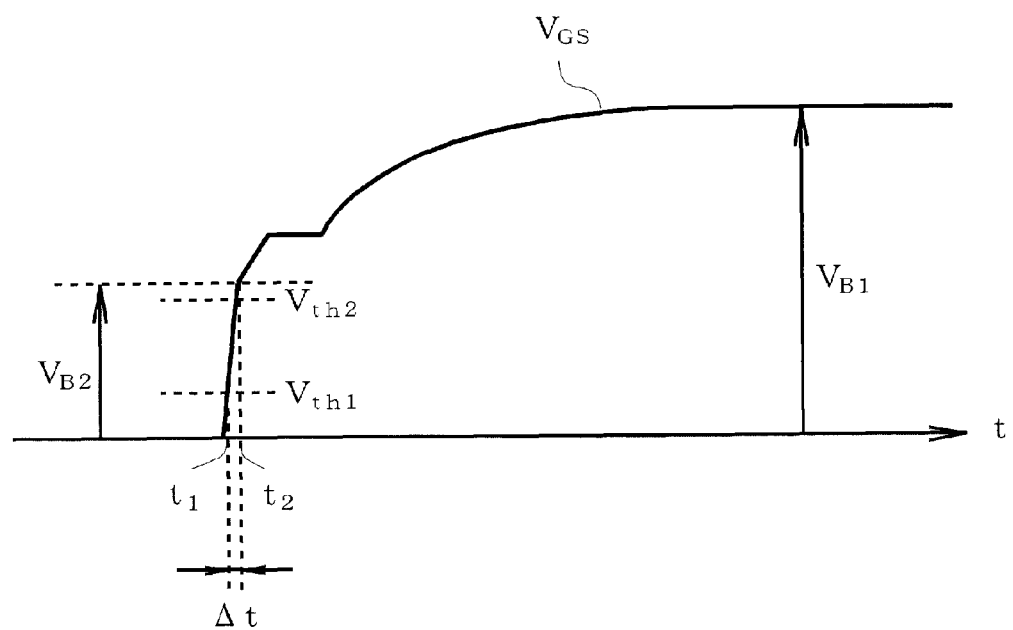
FIG. 3 is a waveform diagram showing the waveform of the gate-source voltage for the switching devices driven by the gate drive circuit shown in FIG. 1.
Figure 4:
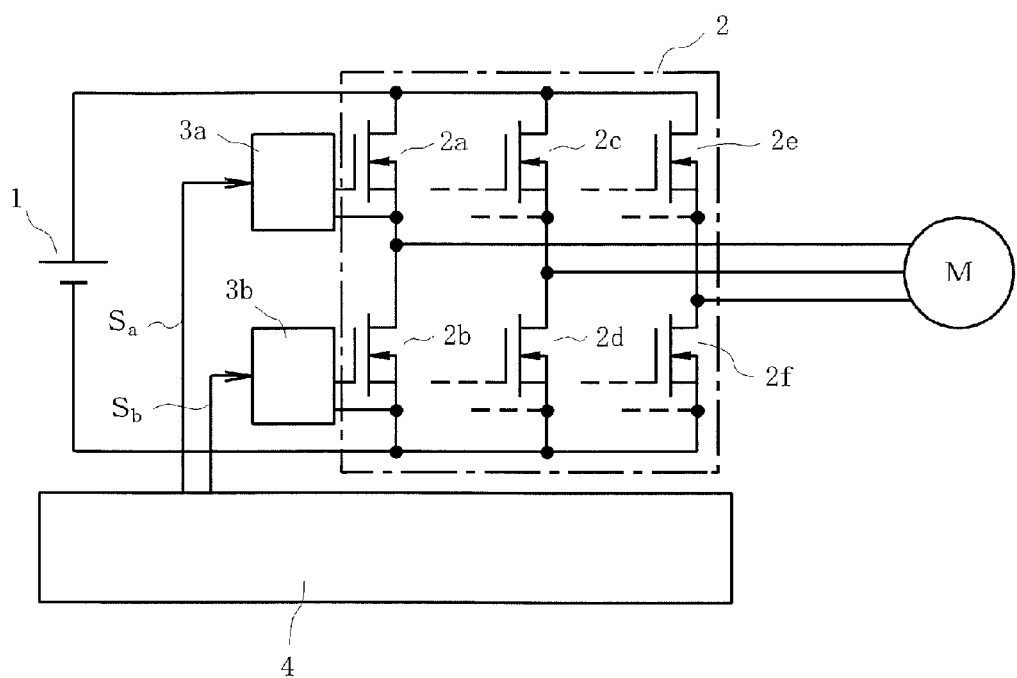
FIG. 4 is a diagram showing the configuration of a main circuit of an inverter using voltage driven semiconductor switching devices.
Figure 5:
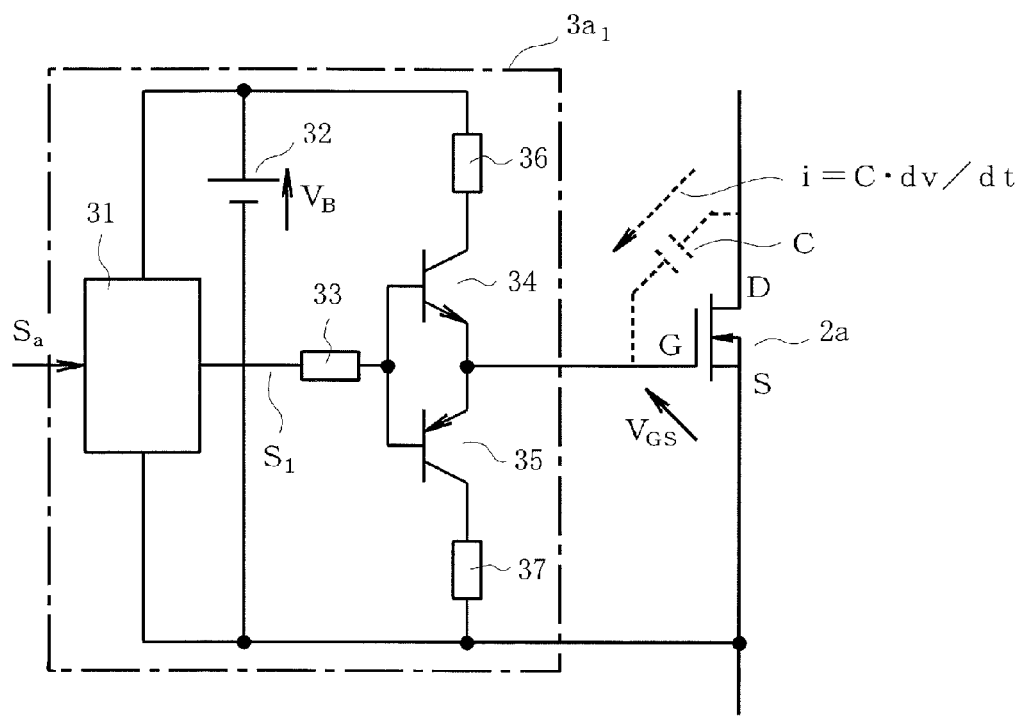
FIG. 5 is a diagram showing the configuration of a gate drive circuit as a first related art.
Figure 6:
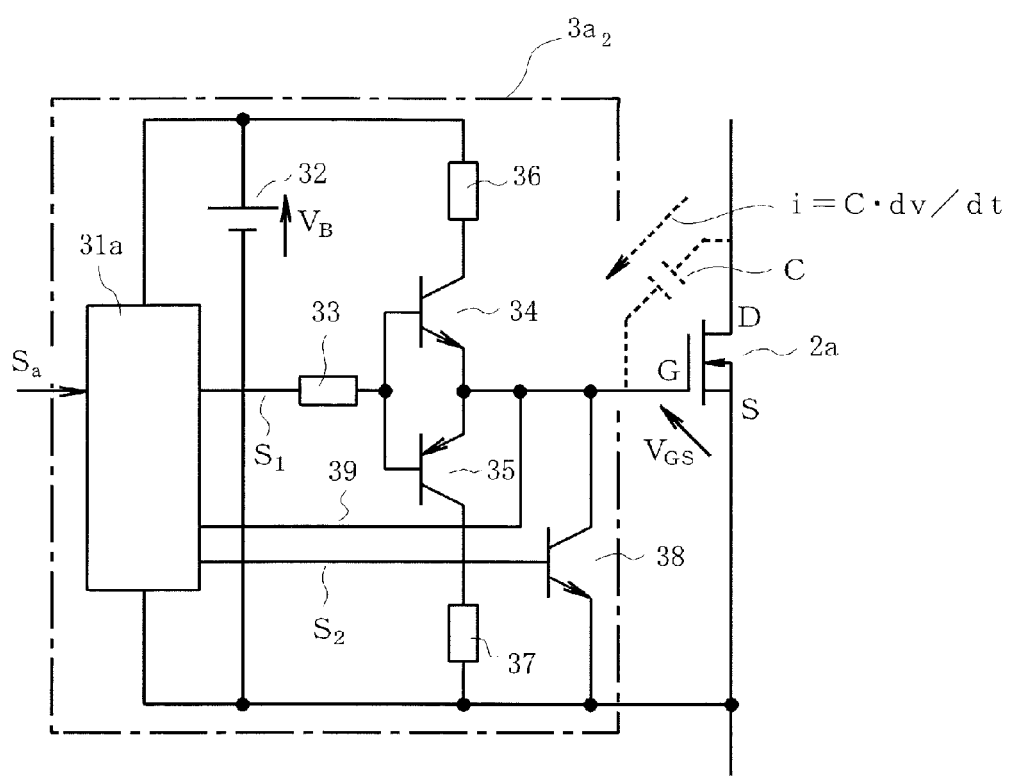
FIG. 6 is a diagram showing the configuration of a gate drive circuit as a second related art.

Therefore, even though there is a difference between the gate threshold voltages $V_{th1}$ and $V_{th2}$ of their respective switching devices 2a and 2a', each of the gate-source voltages $V_{GS}$ thereof rises rapidly with a large rate of change in voltage dv/dt until the gate-source voltage $V_{GS}$ reaches the voltage $V_{B2}$ as is shown in FIG. 3, a waveform diagram showing the waveform of the gate-source voltage for the switching devices driven by the gate drive circuit shown in FIG. 1. This considerably shortens each of the times elapsed from the rising of the gate-source voltage $V_{GS}$ to the times $t_1$ and $t_2$ at which the gate-source voltage $V_{GS}$ reach the threshold voltage $V_{th}$ and $V_{th2}$, respectively, to considerably shorten the time lag Δt between the time $t_1$ and $t_2$.

In addition, for preventing the transistor 43 from having an excessive current flow therein, a current limiting resistor, having a very low resistance value compared with those of the current limiting resistor 36 and 37, may be connected in series on the emitter side or on the collector side of the transistor 43.

Figure 9:
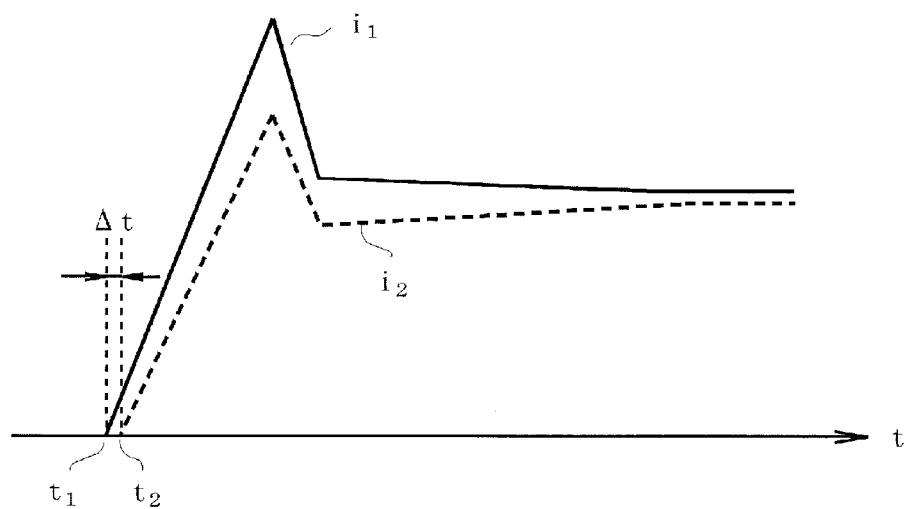
FIG. 9 is a waveform diagram showing waveforms of the drain currents of the two switching devices connected in parallel in the case in which the difference between the threshold voltages of the two switching devices is small.
Figure 10:
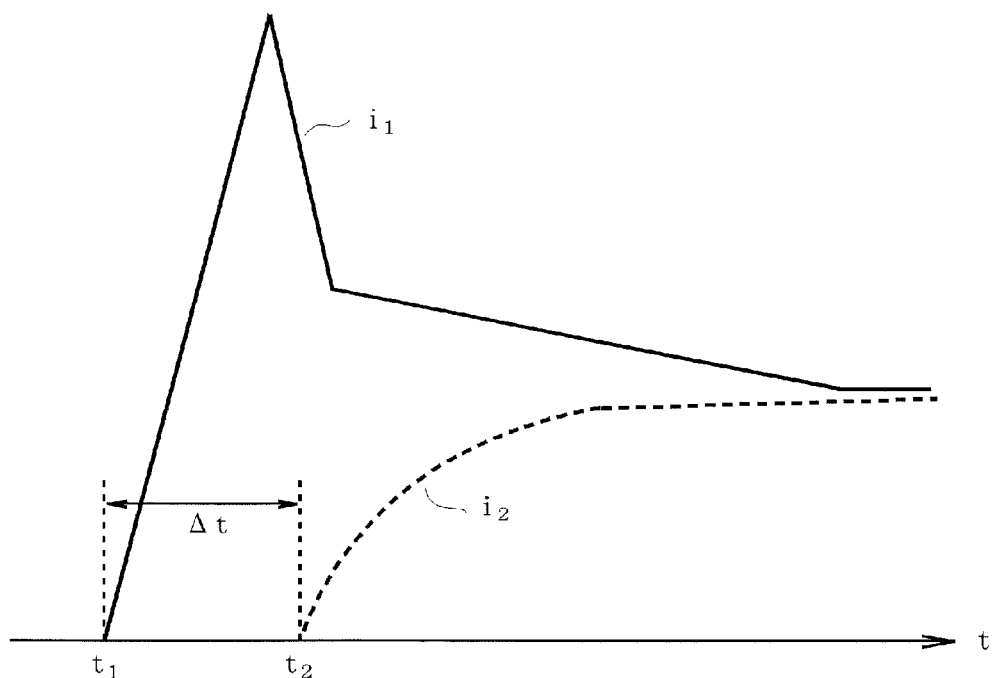
FIG. 10 is a waveform diagram showing waveforms of the drain currents of the two switching devices connected in parallel in the case in which the difference between the threshold voltages of the two switching devices is large.
Figure 11:
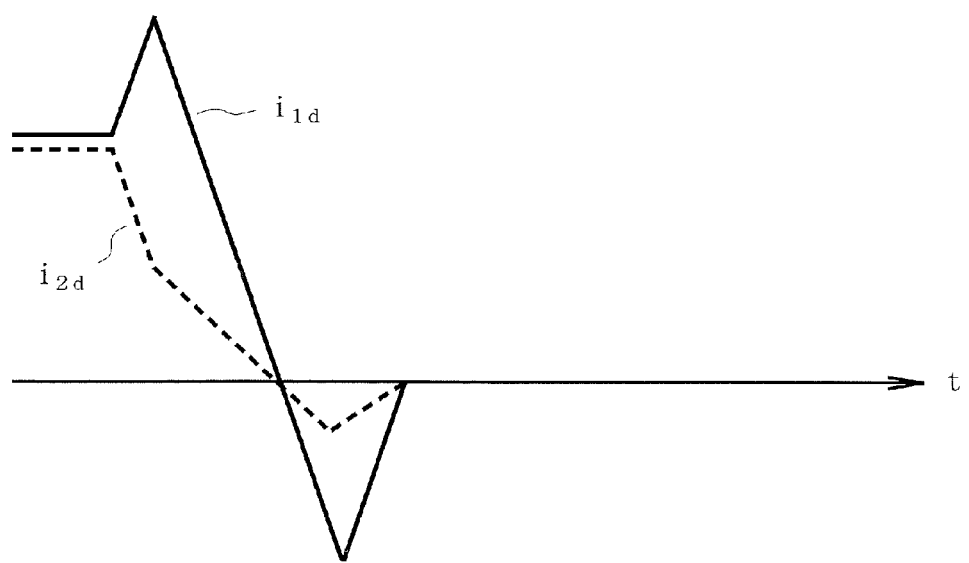
FIG. 11 is a waveform diagram showing the waveforms of currents of two diodes at the reverse recovery thereof which diodes are respectively connected to two switching devices connected in parallel to each other in the arm on the opposite side of the arm provided with two semiconductor switching devices having a large difference between their respective gate threshold voltages and being connected in parallel to each other.

According to the embodiment, an imbalance between currents and resulting imbalance between losses at the turning-on of the switching devices 2a and 2a' are eliminated, by which the waveforms of the drain currents at turning-on in both devices become as those presented in FIG. 9 showing the case in which the difference between threshold voltages $V_{th}$ of both of the switching devices is small. With the waveforms of the currents in the switching devices 2a and 2a' becoming approximately identical, the waveforms of the currents flowing in the diodes in the arm opposite to the arm provided with the switching devices 2a and 2a' also become approximately identical. With this, also on the diode side, the imbalance between currents as is shown in FIG. 11 and the resulting imbalance between losses come to be eliminated.

At the turning-off of the switching devices 2a and 2a', the transistors 35 and 45 are made to be turned-off by the signal $S_1$ outputted from the driving section 31 to instruct turning-off. At the time, the transistor 35 on the input side is made turned-on earlier than the transistor 45 because the turn-off delay circuit 41 is connected to the bases on the side of the transistor 45.

With this, charges in the gates of the switching devices 2a and 2a' are gradually discharged through the transistor 35 and the resistor 37 with the transistor 45 made turned-on thereafter.

Here, the turn-off delay circuit 41 performs the function of securing gate resistance for the switching devices 2a and 2a' at the turning-off operations thereof by the current limiting resistor 37 so that the falling of the gate-source voltage of each of the switching devices 2a and 2a' is prevented from becoming excessively abrupt and, along with this, performs the function of preventing faulty turning-on operations of the switching devices 2a and 2a' without using any special IC, which operations are possibly caused by the turning-on of the switching devices in the opposite arm after the completion of the turning-off operations of the switching devices 2a and 2a'. It is necessary only that the turn-off delay circuit 41 can delay the turning-on operation of the transistor 45 behind the turning-on operation of the transistor 35. Therefore, a specified delay time can be provided by forming the turn-off delay circuit 41 with a circuit such as an RC circuit that is formed of a resistor with a resistance value R and a capacitor with a capacitance value C to provide a time constant RC, for example.

In normal turned-off states of the switching devices 2a and 2a' other than transient states in which the switching devices 2a and 2a' are made to be turned-off from turned-on states, the gate and source of each of the switching devices 2a and 2a' are being short-circuited with an approximate zero impedance by bringing the transistor 45 to be being in a turned-on state. Therefore, at the reverse recovery of each of free-wheeling diodes (or body diodes) of the switching devices 2a and 2a' in the state in which a large reverse voltage is applied to the switching devices 2a and 2a' and the diodes by the turning-on of switching devices in the arm opposite to the arm with the switching devices 2a and 2a', even though a reverse recovery voltage is produced with a large voltage variation rate dv/dt, the switching devices 2a and 2a' have no gate-source voltages $V_{GS}$ exceeding their respective threshold voltages $V_{th1}$ and $V_{th2}$. Thus, it becomes possible to prevent the upper and lower arms from being short-circuited by the faulty turning-on operations of the switching devices 2a and 2a'.

As was explained in the foregoing, according to the embodiment, only by adding the circuit formed of components such as the DC power supply 46, transistor 43 and transistor 45 to a related gate drive circuit, the gate drive circuit can perform the function of inhibiting an imbalance in current between the switching devices connected in parallel to each other in the main circuit due to the difference between the gate threshold voltages of the switching devices and the function of preventing the upper and lower arms from being short-circuited when switching devices in the opposite arm are made to be turned-on.

The gate drive circuit according to the embodiments of the invention can be applied to various kinds of electric power converters such as inverters, converters and choppers when the circuit is used for driving a plurality of voltage-driven semiconductor switching devices connected in parallel to each other.

While the present invention has been particularly shown and described with reference to an embodiment thereof, it will be understood by those skilled in the art that the foregoing and other changes in form and details can be made therein without departing from the spirit and scope of the present invention.

What is claimed is:

1. A gate drive circuit commonly connected to gates of a group of switching devices to drive the group of switching devices, the group of switching devices being voltage-driving type semiconductor switching devices, the gate drive circuit comprising:
    a first switch for turning-on the group of the switching devices;
    a second switch connected in series to the first switch to turn-off the group of the switching devices;
    a first current limiting resistor limiting current flowing in the first switch;
    a second current limiting resistor limiting current flowing in the second switch;
    at least a first DC power supply as a power supply for driving the first switch and the second switch;
    a third switch configured to be turned-on by a turning-on instruction signal to the first switch to turn-on the group of the switching devices;
    a fourth switch configured to be turned-off by a turning-off instruction signal to the second switch to turn-off the group of the switching devices; and
    a second DC power supply connected across a DC circuit including the third switch and the fourth switch as a power supply for driving the third switch and the fourth switch with a voltage value lower than the voltage value of the first DC power supply, thereby making lower an impedance of a path of a current flowing from the second DC power supply to the gates of the group of the switching devices through the third switch in a turned-on state than an impedance of a path of a current flowing from the first DC power supply to the gates of the group of the switching devices through the first switch in a turned-on state.

2. The gate drive circuit for semiconductor switching devices as claimed in claim 1, wherein the value of the voltage of the second DC power supply is made to be approximately equal to a maximum value of gate threshold voltages of the group of switching devices.

3. The gate drive circuit as claimed in claim 2, further comprising a turn-off delay circuit for delaying a timing of turning on the fourth switch for a specified time from after the second switch is turned on.

4. The gate drive circuit as claimed in claim 3 wherein the second DC power supply is formed of a series circuit of a resistor and a Zener diode, which series circuit is connected across the first DC power supply, and a capacitor connected in parallel to the Zener diode, a voltage across the capacitor being used as the voltage value of the second DC power supply.

5. The gate drive circuit as claimed in claim 2 wherein the second DC power supply is formed of a series circuit of a resistor and a Zener diode, which series circuit is connected across the first DC power supply, and a capacitor connected in parallel to the Zener diode, a voltage across the capacitor being used as the voltage value of the second DC power supply.

6. The gate drive circuit as claimed in claim 1, further comprising a turn-off delay circuit for delaying a timing of turning on the fourth switch for a specified time from after the second switch is turned on.

7. The gate drive circuit as claimed in claim 6 wherein the second DC power supply is formed of a series circuit of a resistor and a Zener diode, which series circuit is connected across the first DC power supply, and a capacitor connected in parallel to the Zener diode, a voltage across the capacitor being used as the voltage value of the second DC power supply.

8. The gate drive circuit as claimed in claim 1, wherein the second DC power supply is formed of a series circuit of a resistor and a Zener diode, which series circuit is connected across the first DC power supply, and a capacitor connected in parallel to the Zener diode, a voltage across the capacitor being used as the voltage value of the second DC power supply.

* * * * *